United States Patent [19]
Ehrhart et al.

[11] Patent Number: 6,083,660
[45] Date of Patent: Jul. 4, 2000

[54] PHOTOPOLYMERIZABLE, COATABLE ORGANOSOL AND METHOD

[75] Inventors: Wendell A. Ehrhart, Red Lion; David A. Smith, York, both of Pa.

[73] Assignee: Armstrong World Industries, Inc., Lancaster, Pa.

[21] Appl. No.: 08/439,548

[22] Filed: May 11, 1995

Related U.S. Application Data

[60] Division of application No. 07/917,649, Jul. 23, 1992, Pat. No. 6,060,214, which is a continuation-in-part of application No. 07/546,814, Jul. 2, 1990, abandoned.

[51] Int. Cl.[7] .............................. G03C 1/73; C08J 5/34; C08J 5/17; C08L 5/17
[52] U.S. Cl. .................................. 430/281.1; 430/288.1; 430/910; 522/114; 522/121; 522/126; 524/96; 524/247; 524/249; 524/251
[58] Field of Search .................................. 430/281, 288, 430/910, 281.1, 288.1; 522/79, 114, 126, 121; 524/247, 249, 251, 96

[56] References Cited

U.S. PATENT DOCUMENTS

| | | | |
|---|---|---|---|
| 2,548,433 | 4/1951 | Klein et al. | 260/29.1 |
| 3,845,066 | 10/1974 | Vasta | 260/29.6 |
| 3,940,349 | 2/1976 | Corbett | 260/2.5 |
| 4,071,639 | 1/1978 | Palmer et al. | 427/156 |
| 4,276,366 | 6/1981 | McCartin et al. | 430/291 |
| 4,309,331 | 1/1982 | Graham | 260/30.6 |
| 4,357,413 | 11/1982 | Cohen et al. | 430/253 |
| 4,414,354 | 11/1983 | Slocombe | 524/460 |
| 4,454,219 | 6/1984 | Yamadera et al. | 430/281.1 |
| 4,537,805 | 8/1985 | Lin | 427/54.1 |
| 4,877,714 | 10/1989 | Tsunoda et al. | 430/270.1 |
| 4,957,850 | 9/1990 | Kusuda et al. | 430/271.1 |
| 4,996,132 | 2/1991 | Tazawa et al. | 430/286.1 |

*Primary Examiner*—Bernard Codd
*Attorney, Agent, or Firm*—Womble Carlyle Sandridge & Rice

[57] ABSTRACT

Photopolymerizable plastisol and organosol photoresist and solder mask coating compositions are described herein. These compositions include an ethylenically unsaturated photopolymerizable liquid plasticizer; a particulate, thermoplastic resin is dispersed in the plasticizer, the said resin having a midpoint Tg greater than 110° C. and an acid number greater than 110; a tertiary amine stabilizer; and a photoinitiator. The organosol includes a diluent along with the other ingredients.

12 Claims, No Drawings

PHOTOPOLYMERIZABLE, COATABLE ORGANOSOL AND METHOD

CROSS-REFERENCE TO RELATED APPLICATION

This is a divisional of application Ser. No. 07/917,649, filed Jul. 23, 1992, now U.S. Pat. No. 6,060,214 which is a continuation-in-part of U.S. Ser. No. 546,814, filed Jul. 2, 1990, entitled "A Photopolymerizable, Coatable Plastisol" now abandoned.

BACKGROUND OF THE INVENTION

FIELD OF THE INVENTION

This invention relates to photocurable plastisol and organosol coating compositions. More particularly, it relates to fusible photopolymerizable plastisol and organosols which are photoimagable resists and solder masks.

The plastisol and organosol compositions that are described herein have several advantages over other photoresist and solder mask coating compositions. Both the organosols and the plastisols avoid the problems such as non-uniform mixing and inaccurate metering that is found with two part liquid systems. Further advantages to the present system are contact imagability, aqueous alkali developability, good resolution, and the ability to be used with a variety of application techniques including screen printing.

In addition to these advantages, the present compositions have advantages over known plastisol-organosol compositions. Specifically, known plastisol-organosols disadvantageously, do not have adequate shelf lives, and in fact plastisol-organosol systems of industry, characteristically, suffer from short shelf lives. The plastisol-organosol compositions described herein, however, have a shelf stability that provides remarkably long shelf lives. These long shelf lives are a very needed advantage for the commercial marketing of the photoimagable resist and solder mask plastisol coating composition.

BRIEF DESCRIPTION

Fusible photopolymerizable plastisol photoresist and solder mask coating compositions comprise an ethylenically unsaturated photopolymerizable liquid plasticizer; a particulate, thermoplastic resin which is dispersed in the plasticizer, the said resin having a midpoint Tg greater than 110° C. and an acid number greater than 110; a tertiary amine stabilizer selected from the group consisting of triethyl amine, N-butyl diethanol amine, 4-methyl morpholine, and dimethyl aminoethanol; and a photoinitiator. To obtain an organosol, a diluent is used along with the other ingredients.

In fact, these particular stabilizers can be combined with a plastisol comprising the above described resin dispersed in a plasticizer. An improved (longer) shelf life is obtained. Any plasticizer, including a non-reactive plasticizer (such as dioctyl phthalate) can be used.

The coatable, photoreactive plastisol compositions are fused to form contact imagable layers that are aqueous developable. For aqueous developability the resin included in the plastisol is soluble and/or dispersible in a basic aqueous solution. This eliminates a resin that is not soluble or disperible in aqueous base. Polyvinyl chloride (PVC) resin (including homopolymers and copolymers), is not included in the instant plastisols unless it allows aqueous developability.

Although non-PVC plastisols (containing no resin having vinyl chloride monomer) are traditionally known to have short shelf lives the instant combination provides stable, photosensitive plastisols because of the tertiary amine stabilizer. With the present compositions a shelf life in excess of 6 months is not unusual. If the tertiary amine stabilizer is not included, the photopolymerizable plastisol will have little to no shelf-life.

DETAILED DESCRIPTION

To make these coatable dispersions, the resin polymer is dispersed in the liquid ingredients. The ingredients can be mixed in any convenient order. A preferred method, however, is to add the amine to the liquid ingredients, followed by dispersing the resin.

The liquid plasticizers used for the present plastisol and organosol compositions are ethylenically unsaturated. They provide photopolymerizability to the coating compositions. The plasticizers can be selected from monomers, oligomers, and prepolymers. Preferred photoreactive acrylate species have two or more acrylate moieties. Highly preferred plasticizers are water sensitive; for example, highly alkoxylated (meth)acrylates. Such plasticizers can be selected from the group consisting of ethoxylated bisphenol-A-diacrylate, ethoxylated trimethylol propane triacrylate, tripropylene glycol diacrylate, alkoxylated acrylates, tetraethylene glycol diacrylate, neopentyl glycol propoxylate diacrylate and polyethylene glycol di(meth)acrylate.

The plasticizer is suitably used at a concentration in the range of from about 30 to about 70% by wt. (based on the total weight of the resin and plasticizer), and preferrably is present at an amount in the range of from about 40 to about 60% by wt. When contact imagability is important the plasticizer can be in the preferred range of from about 60% by wt. or less to about 30%. For contact imagability it is also preferred that the weight ratio of the plasticizer:resin be in the range of from about 0.65 to about 1.25.

Without the amine stabilizers, the present compositions would have to have a plasticizer that did not swell or dissolve the resin at ambient conditions. In this respect the instant compositions have an advantage over known plastisols which must be limited to plasticizers that do not readily swell or dissolve the resins. By including the tertiary amino stabilizers the present compositions can use any plasticizing ethylenically unsaturated photopolymerizable acrylate species. The use of the tertiary amine stabilizer allows the use of plasticizers that will swell, and even gradually dissolve the resin without the stabilizer present.

The tertiary amine stabilizer will act to stabilize and provide an extended shelf life for the plastisol, for any plasticizer-resin combination used. Even the more swellable, more soluble resins will be given a longer shelf life by the amine stabilizer. The more preferred combinations, however, use a less soluble, higher molecular weight resin to provide the most stable plastisol with the longest shelf life. Without the tertiary amine stabilizer, the plastisol compositions would have to be used within at least about 36 hours. The shelf life of the plastisol in the length of time that the plastisol can still be used. If the plastisol gels it is considered no longer usable, and the shelf life has ended.

As time passes the viscosity of the plastisol increases, and after such short periods of time the viscosity gets too high. It is preferred that the viscosity of the instant plastisols be less than about 200,000 cps. The plastisol viscosity is used at a level that is effective to allow the plastisol to be drawn into a film or layer on a suitable substrate.

The resin is a thermoplastic polymer with an acid number of 110 or more, and a midpoint Tg of 110° C. or better. A good range for the acid number of the polymer is from 110 up to 290. Preferably, the midpoint Tg is 145° C. or more. Preferably, the Tg is in the range of from about 115 to about 175, and the acid number in in the range of from about 150 to about 200.

The resin is used in particulate form. The resin particles can be any size which the plastisol technology includes. Thus, the resin can include resin particles down to virtually any size found in a plastisol. A preferred largest particle size of the resin is about 300 microns or less, particularly for a screen printable plastisol, and most preferably the largest particle size of the resin is about 60 microns or less. Preferably the average particle size is greater than about 1 micron.

Preferred, screen printable plastisols can be prepared having 95% by wt. of the particles in sizes ranging from about 60 to about 1 micron in diameter. Most preferably, the average particle size is in the range of from 35 to about 1 micron. Where contact imagability is important the average particle size preferably is at least about 5 microns in diameter, a preferred range then being from about 60 to about 5 microns and a most preferred range being from about 35 to about 5 microns.

Any technique used for the preparation of non-PVC resin can be used to make the resin and prepare the particles for the plastisol. This includes steps such as grinding and milling down the particle sizes.

Any polymer or copolymer having an acid moiety can be used. Preferred resins are higher in molecular weight, and will be less soluble in the plasticizer. While a resin can acceptably have a molecular weight of about 25,000 or more (weight average molecular weight), a more preferred molecular weight is about 35,000 or greater, and most preferably, it is greater than about 75,000. When less solubility is needed, the molecular weight can be increased. Preferred copolymers have acidic monomers selected from the group consisting of acrylic acid, methacrylic acid, maleic acid half ester, maleic anhydride, fumaric acid, fumaric acid half ester, and maleic acid. Other preferred polymers include copolymers of N-alkylacrylamide/alkylamino methacrylate/alkyl(meth)acrylate/(meth)acrylic acid such as octylacrylamide/acrylate/butylaminoethyl methacrylate polymer (amphomer). The resin can be selected from the group consisting of, a copolymer of styrene and maleic acid half ester and a copolymer of N-alkylacrylamide/alkylamino (meth)acrylate/(meth)acrylic acid. Preferably the resin is a polymer selected from the group consisting of: polyoctylacrylamide/acrylate/butylaminoethylmethacrylate and styrene maleic anhydride polymeric ester.

The resin is suitably used at a concentration in the range of from about 30 to about 70% by weight (based on the total amount of the resin and plasticizer), and preferably is present at an amount in the range of from about 40 to about 60% by wt. When contact imagability is important the most preferred range is from about 40 to about 70% by wt.

The tertiary amine stabilizers are particularly good for giving shelf stability to plastisols of non-PVC resins (resins that contain no polymer or copolymer having vinyl chloride monomer. Although, by including the tertiary amine stabilizers, plastisols with copolymers having less than about 80% of the vinyl chloride monomer can also be given an extended shelf life. Copolymers of vinyl chloride monomer can be included in amounts which allow aqueous alkali developability. Other monomers which can be used in the resin copolymers in the instant plastisols are olefin having terminal unsaturation, ethylene, propylene, atyrene, vinyl toluene, (meth)acrylate esters, vinyl acetate, and other terminally unsaturated esters (such as acrylate esters). Such copolymers and monomers are included in amounts which are effective to permit aqueous alkali developability.

The tertiary amine stabilizer is a weak base. The plastisol stabilizer acceptably is selected from the group consisting of triethyl amine, 4-methyl morpholine, and an N-butyl diethanol amine and dimethyl aminoethanol. Preferred stabilizers are selected from the group consisting of triethyl amine, and 4-methyl morpholine. An effective amount of the amine stabilizer will maintain coatability for an extended period of time. Acceptably, the amine stabilizer can be used in an amount of from about 1 to about 10 (phr). A preferred amount of stabilizer in the plastisol is from about 1.5 to about 4 (phr) parts by weight per hundred parts of resin.

With the present invention the stabilizer (preferably 4-methyl morpholine) extends the useful life of plastisols. Problems such as gelling and solubilization of the resin particles are deterred and even prevented. Such highly preferred tertiary amine stabilizers are good where the plastisol or organosol contains some very small particles (even less than 0.1 micron).

The instant plastisols will also contain a photoinitiator. The photoinitiator is acceptably used at an amount in the range of from about 1 to about 15% by wt. and preferably it is at an amount in the range of from about 2 to about 12% by wt. Any initiator of the photopolymerization reaction can be used. Preferred photoinitiators also act as a photosensitizer. One or more photoinitiators or a photoinitiator and a sensitizer can be used. Conventionally used and available initiators and systems are also suitable.

Suitable photoinitiators include benzoin and benzoin derivatives such as benzoin ethers; substituted benzoins and substituted derivatives like benzilketals and benzoyldiaryphosphine oxides that are known, effective photoinitiators. Preferred initiators are those of the benzophenone type and derivatives thereof such as benzophenone, 4,4-dimethylaminobonsophenone, 4,4-diethylaminobenzophenone, or derivatives of Michler's ketone, 4,4-dichlorobenzophenone and hexaarylbisimidazoles. Sensitizing agents that can be combined include compounds such as 2-mercaptobenzoquinazole, substituted or unsubstituted polynuclear quinones such as anthraquinone, bensanthraquinone, 2-ethylanthraquinone, and tert-butylanthraquinone and acridine or phenacine derivatives which are also effective photoinitiators. Preferred photoinitiators are to be selected from the group consisting of isopropylthioxanthone and 2-methyl-1[4 (methylthio)phenyl]-2-morpholinopropane. Most preferably these two are combined, The organosol is a colloidal dispersion of a synthetic resin in a plasticizer in which the dispersion's volatile content exceeds 5% of the total (Hawley's Condensed Chemical Dictionary, 11th edition, published by Van Nostrand Reinhold Co., New York, 1987).

The diluent included in the organosol is non-reactive. It is non-swelling with respect to the resin, and is miscible with the plasticizer. The diluent is volitilizable, (driven off with heat).

Suitably the diluent (also called a "solvent") can be included at amounts up to 10% by wt. of the composition. The maximum amount of diluent to be included in the plastisol is about 10% by weight because large amounts of diluent result in phase separation. Thus, the diluent in the organosol is from 5% to about 10% by weight of the coating composition. Aliphatic hydrocarbon solvents can be used. Preferred solvents are mineral spirits taken from the odorless boiling range.

Other ingredients that can be included in the plastisols and organosols include photosensitizers, pigments, thermal polymerization inhibitors, flow aids, dyes, anti-foams and surfactants.

If a separate photosensitizer is used it can be added in amounts up to about 5% by wt. Dyes can be used in the amounts effective to color and surfactants can also be used in amounts needed. Thermal polymerization inhibitors such as phinothiazine, mono methyl ether of hydroquinone, hydroquinone can be included. Thermal polymerization inhibitors suitably can be included in amounts effective to prevent thermal reaction. They can be used in amounts up to about 1 phr.

These plastisol compositions are excellent solder masks and photoresists. To prepare a resist or solder mask, the plastisol is drawn into a layer which is then fused with heat. The layer can then be photoimaged, and then developed with aqueous base. Excellent resolution can be obtained.

EXAMPLES

The examples which follow are offered to illustrate the instant invention and not to limit it. All parts and percentages are by weight unless otherwise indicated.

Plastisol Preparation

The plastisols in the following examples were prepared in accordance with the following description.

First, the ethylenically unsaturated plasti-cizer(s) used in each example was combined with the photoinitiator(s) and the following additives when they were used: free radical thermal polymerization inhibitors, flow agents, bubble breakers, and pigments. When needed in order to dissolve solids materials such as the free radical thermal polymerization inhibitors, a small amount of heat was used.

Thereafter, the solution was cooled, and where the tertiary amine was used, it was added to the solution after it had cooled to approximately room temperature. Stirring was maintained while the tertiary amine was added. In all of the cases, the resin was then added slowly with vigorous stirring until it was dispersed, thus forming the plastisol.

Example 1

The ethylenically unsaturated plasticizers used were:

| | Amount |
|---|---|
| Ethoxylated Bisphenol-A-diacrylate (Sartomer 349) | 34.8 g |
| Ethoxylated Trimethylenol Propane Triacrylate (Sartomer 454) | 60 g |

To the liquid plasticizers, the following solids ingredients were added and dissolved with slight warning.

| Ingredient | Amount |
|---|---|
| 2-Methyl-1[4(methylthio)phenyl]-2-morpholino-propane (photoinitiator) (Irgacure 907-Ciba-Geigy) | 12 g |
| Isopropylthioxanthone (photoinitiator) (Quantacure ITX from Ward Blenkinsop) | 4 g |
| Phenothiazine | .01 g |
| UV Green Pigment Paste (Pennco color Pennco green 965) | 4 g |

Also added was a liquid resin modifier (Moda-flow by Monsanto) in an amount of 2 grams (g).

Styrene maleic anhydride polymeric ester resin (Scripset 550 by Monsanto) was used in the amount of 102 grams.

After the plastisol was prepared, the viscosity (wt. average) was measured using the Brookfield Viscometer at 5 RPM, #6 spindle. The initial viscosity was measured at 140,000 cps at 75° F.

This plastisol was screen printed onto a cleaned copper-clad laminate and then was fused for 40 minutes at 140° C.

The film which was prepared was then contact photoimaged. It was covered with artwork and exposed with 170 mj of UV radiation. The unexposed areas were then removed with a 1% aqueous sodium carbonate solution. The remaining film was then post-cured with 3.5 J of UV radiation from a high pressure mercury vapor lamp and then was baked for one hour at 150° C.

The solder mask which resulted was a hard tough film with good chemical resistance of thermal properties.

The unused portion of this formulation gelled in a few days (less than a week). After gelling it was not coatable and could not be used.

Example 2

The same formulation was used as is described in Example 1. An amount of 5 grams of the stabilizer 4-methylmorpholine was added. As a result, the initial viscosity was lowered to 17,200 cps.

The composition thus prepared was coated and processed as previously described in Example 1. The solder mask which resulted was a hard tough film with good chemical resistance and thermal properties.

The formula prepared under Example 2, however, was still screen printable after 12 months of aging.

Example 3

The following premix was prepared:

| Ingredients | Amounts (in grams) |
|---|---|
| Plasticizer (Sartomer 349) | 800.0 |
| Plasticizer (Sartomer 295) Pentaerythritol tetraacrylate | 260.0 |
| Plasticizer (Sartomer 9040) Alkoxylated Diacrylate ester | 150.0 |
| Phenothiazine free Radical Inhibitor | 1.250 |
| Irgacure 907 (Photoinitiator) | 100.0 |

-continued

| Ingredients | Amounts (in grams) |
| --- | --- |
| Quantacure ITK (Photoinitiator) | 25.0 |
| Green PG5 paste (pigment) | 50.0 |
| Modaflow (surfactant) | 25.0 |
| BB3056A bubble breaker | 25.0 |

Once the premix was cooled 60.0 g of 4-methylmorpholine was added with stirring, followed by 1250 g of Scripset 550 which was ground in a ball mill until the largest particle was less than 65 microns. The 24 hr. viscosity was 62000 cps (10 rpm, #6 spindle, 25 C).

The resulting plastisol was screen printed onto a multi-layer surface mount circuit board using a 140T polyester screen and a 70 durometer squeegee. The first side was vertically racked and fused for 15 minutes at 230° F. This was repeated for the second side. The circuit boards were photoprinted using a timer exposure with a lamp intensity of approximately 10 mw/cm$^2$. They were given 300 mj exposure and a Stouffer step of 11–12 was obtained. Following exposure the negative is removed from the mask and the unexposed, uncured solder mask was washed from the circuit board exposing the pads and cleaning out of the holes. This development was carried out in 3 minutes using an ASI horizontal developer containing a 1% aq. sodium carbonate solution at 106° F. After developing the boards were water rinsed and hot air dried. They were then given a UV bump of 3.5 J/cm$^2$ followed by a post bake of 300° F. for 75 minutes. The resist protected circuit board was then soldered using a commercial hot air leveling equipment and an aqueous flux. Inspection of the board showed the cured solder resist withstood the soldering environment and adhered well to the board.

Example 4

A clear solder mask was prepared. The following ingredients were mixed with slight warming.

| Ingredients | Amounts (in grams) |
| --- | --- |
| Plasticizer Sartomer 349 | 80.0 |
| Plasticizer Sartomer 295 | 26.0 |
| Plasticizer Sartomer 9040 | 19.0 |
| Phenothiazine (free radical inhibitor) | 0.1250 |
| Irgacure 907 (photoinitiator) | 10.0 |
| Quantacure ITX (photoinitiator) | 2.5 |
| Modaflow (surfactant) | 2.5 |
| BB3056A bubble breaker | 2.5 |

After cooling 6 g of 4-methylsorpholine was changed and mixed. Then, 125 g of ground Scripset 550 (ground as described in Example 3) was changed with stirring. The initial viscosity was 39,300 cps at 25° C., 10 rpm No. 6 spindle.

A mask was screen printed with a 124 mesh polyester screen onto a copper clad laminate. It was fused for 30 minutes at 250° F. to a tackfree film. The mask was photoimaged using a Co-light exposure unit for 70 seconds under vacuum. It was given an exposure of 189 mj/cm$^2$ The uncured areas were washed away in 3 minutes using a 1% aqueous sodium carbonate solution at 105° F. and 30 psi of pressure. The board was rinsed with water and hot air dried. The mask was UV bumped at 3.5 J/cm$^2$ and post baked for 1 hour at 300° F. The resulting mask had a crosshatch adhesion of 4.5 out of 5 and showed it could withstand a methylene chloride for 4 minutes, 13 seconds, before it started to swell the fine lines of the IPC test pattern.

Example 5

Plastisols were prepared using triethylamine as the stabilizer.

In accordance with previously given plastisol preparation the samples A, B and C were prepared:

For Sample A: 2000 g Sartomer 349, 1900 g Photomer 4028 (ethoxylated Bisphenol A diacrylate), 440 g Sartomer 454, 400 g tripropylene glycol diacrylate (Sartomer 306), 5.0 g phenothiazine, 500 g Irgacure 907 photoinitiator, 200 g Quantacure ITX photoinitiator and 200 g of Green PG5 paste pigment. To 155.9 g of this premix 5.0 g (2 phr) of triethylamine and 127.5 g of ground Scripset 550 (ground as described in Example 3) were charged with stirring. The 24 hr. viscosity was 65,200 cps, the 3 day viscosity was 78,400 cps and the 13 day viscosity was 127,600 cps.

For Sample B: 6.0 g (2–4 parts per hundred parts of resin phr) of triethylamine was used with the ingredients of Sample A. The 24 hr. viscosity was 109,400 cps, the 3 day viscosity was 128,000 cps and the 13 day viscosity was 188,000 cps.

For Sample C: 7.5 g (3.5 phr) of triethylamine was used with the ingredients of Sample A.

The 24 hr. viscosity was 113,600 cps, the 3 day viscosity was 134,800 cps and the 13 day viscosity was 254,800 cps.

Example 6

An admixture (pre-mix) was prepared of the following:

| Ingredient | Amount |
| --- | --- |
| Startomer 349 | 1540 g |
| Photomer 4028 | 1190 g |
| S-9035 | 308 g |
| Startomer 306 (Tripropylene Glycol Diacrylate) | 140 g |
| Phenothiazine | 3.5 g |
| Irgacure 907 | 350 g |
| Quantacure ITX | 140 g |
| Modaflow | 35 g |
| Bubble Breaker | 17.5 g |
| Green PCW 965 Paste | 140 g |
| Exxon Mineral Spirits | 140 g |

Using this premix the following organosol formulations were prepared (amounts in grams).

| Sample | A | B | C |
| --- | --- | --- | --- |
| Premix | 90.6 | 80.6 | 80.6 |
| 4-Methyl Morpholine | 1.5 | 2.0 | 2.5 |
| Amphomer | 62.5 | 62.5 | 62.5 |

Amphomer—an acrylic resin (Chemical Name: Octylacrylamide/acrylate/butylamino ethyl methacrylate polymer)

Viscosity Measurements

|  | A | B | C |
|---|---|---|---|
| 1 rpm | 42,000 cps | 36,000 cps | 33,000 cps |
| 10 rpm | 41,200 cps | 34,800 cps | 33,600 cps |

Viscosity measurements at 25° C., 24 hr., #6 spindle.

The samples were then coated on a copper circuit board and then fused for 30 min. at 115° C. to form a dry homogeneous film.

Example 7

Using the previously described method, the following plastisols were prepared:

Sample A

| Plasticizers | Amount (grams) |
|---|---|
| Startomer 349 | 101 |
| Startomer 252 | 10 |
| (polyethylene glycol dimethlacrylate) |  |
| Startomer 9040 | 10 |

| Other Ingredients | Amount (grams) |
|---|---|
| Modaflow | 25 |
| Irgacure 907 | 12.5 |
| Quantacure ITX | 5 |
| Phenothiazine | 0.125 |
| Green Paste | 5 |
| Bubble Breaker | 2.5 |
| Ground Scripset 550 | 125 |
| 4-methyl Morpholine | 6.0 |

3 day viscosity—120,000 cps at 1 rpm and 64,000 cps at 10 rpm.

Sample B

Using the identical ingredients indicated for Sample A above, the following plasticizers were used:

| Plasticizers | Amounts (grams) |
|---|---|
| Startomer 349 | 100 |
| Startomer 454 | 11 |
| Startomer 4127 | 10 |
| (Neopentylglycol propoxylate diacrylate) |  |

24 hr. viscosity—1 rpm—49,000 cps at 10 rpm—46,600 cps.

Sample 7 (Cont'd.)

Sample C

A plastisol coating composition was md with 127.5 grams (g.) of the scripset 550 resin, the other ingredients indicated for Sample A, and the following plastizers:

| Plasticizer | Amount |
|---|---|
| Startomer 349 | 43.5 |
| Glycerolproxy triacrylate | 75.0 |

Sample D

The ingredients listed above for Sample A were combined with the following plasticizers.

| Plasticizer | Amount |
|---|---|
| Photomer 4025 | 80 |
| (ethoxylated bisphenol A diacrylate) |  |
| Startozner 295 | 26 |
| Startomer 9040 | 15 |

Example 8

The following ingredients were combined with vigorous stirring until the resin particles were dispersed in the liquid ingredients. After a period of time in excess of two years, this plastisol was still liquid and coatable. The Scripset 8550-F was a finer grind of the S550 Scripset.

| Ingredients | Amount (in grams) |
|---|---|
| resin, Scripset S550-F | 1325 |
| diacrylate plasticizer | 550 |
| (Startomer SR-349) |  |
| Photomer 4028 | 425 |
| (ethoxylated bisphenol A diacrylate) |  |
| triacrylate plasticizer | 110 |
| (Startomer SR-454) |  |
| acrylated plasticizer | 50 |
| (Startomer SR-306) |  |
| acrylated plasticizer | 40 |
| (Startomer SR-351) |  |
| photoinitiator | 125 |
| (IRG-907) |  |
| photoinitiator | 50 |
| (Quantacure ITX) |  |
| phenothiazine | 1.125 |
| solid 9G5 green pigment | 10 |
| 4-methylmorpholene | 60 |
| carboxybenzotriazole | 25 |
| mineral spirits | 50 |
| BB3056A bubble breaker | 6.25 |

What is claimed is:

1. A Photopolymerizable, aqueous developable, organosol photoresist and solder mask coating composition comprising
    (1) a plasticizer which is an ethylenically unsaturated photopolymerizable monomer, at an amount in the range of from about 30 to about 70% by weight of the total weight of the resin and plasticizer, (2) a particulate, thermoplastic resin which is soluble or dispersible in a basic aqueous solution and has a midpoint Tg greater than 110° C. and an acid number greater than 110, at an amount in the range of from about 30 to about 70% by weight of the total weight of the resin and plasticizer, wherein the resin is selected from the group consisting of a copolymer of styrene and maleic acid half ester and a copolymer of N-alkylacrylamide/alkylamino(meth)acrylate/(meth) acrylic acid, (3) a tertiary amine stabilizer which is present at an amount in the range of from about 1 to about 10 parts by weight per hundred parts of resin, and is selected from the group consisting of triethyl amine, N-butyl diethanol amine, 4-methyl morpholine, and dimethyl aminoethanol, (4) a photoinitiator, and (5) a volatilizable diluent.

2. The organosol of claim 1 wherein the volatilizable diluent is either (a) an aliphatic hydrocarbon or (b) mineral spirits from the odorless boiling range.

3. The organosol of claim 1 wherein the tertiary amine stabilizer includes the 4-methyl morpholine.

4. The organosol of claim 1 wherein the plasticizer is (a) water sensitive, (b) has two or more acrylate species, or (c) is both water sensitive and has two or more acrylate species.

5. The organosol of claim 1 wherein the photoinitiator is isopropylthioxanthone with 2-methyl-1[4(methylthio) phenyl]-2-morpholinopropane.

6. The organosol of claim 1 wherein the resin does not contain vinyl chloride monomer and the tertiary amine stabilizer is 4-methyl morpholine, triethyl amine, or a mixture of both.

7. The organosol of claim 1 which is contact imagable with a plasticizer:resin ratio in the range of from about 0.65 to about 1.25.

8. A method for the preparation of a plastisol composition comprising the steps (1) combining a tertiary amine stabilizer selected from the group consisting of triethyl amine, N-butyl diethanol amine, 4-methyl morpholine, and dimethyl aminoethanol, and a plasticizer, which is an ethylenically unsaturated photopolymerizable monomer, at an amount in the range of from about 30 to about 70% by weight of the total weight of the resin and the plasticizer, to form an admixture, and then (2) dispersing a resin in the admixture, further providing that the resin is a particulate, thermoplastic resin having a midpoint Tg greater than 110° C. and an acid number greater than 110, at an amount in the range of from about 30 to about 70% by weight of the total weight of the resin and plasticizer, wherein the resin is selected from the group consisting of a copolymer of styrene and maleic acid half ester and a copolymer of N-alkylacrylamide/alkylamino(meth)acrylate/(meth) acrylic acid.

9. The method of claim 8 wherein the resin has a maximum particle size of about 300 microns or less.

10. The method of claim 8 wherein, to prepare an organosol, a volatizable diluent is also added in step (1).

11. The method of claim 8 wherein the tertiary amine stabilizer is present at an amount in the range of from about 1 to about 10 parts by weight per hundred parts of resin.

12. The method of claim 8 wherein a photoinitiator is also combined.

* * * * *